(12) United States Patent
Walters

(10) Patent No.: US 9,287,884 B2
(45) Date of Patent: Mar. 15, 2016

(54) ENHANCED NUMERICAL CONTROLLED OSCILLATOR

(71) Applicant: Microchip Technology Incorporated, Chandler, AZ (US)

(72) Inventor: Bret Walters, Chandler, AZ (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 0 days.

(21) Appl. No.: 14/185,431

(22) Filed: Feb. 20, 2014

(65) Prior Publication Data

US 2014/0232474 A1   Aug. 21, 2014

Related U.S. Application Data

(60) Provisional application No. 61/767,633, filed on Feb. 21, 2013.

(51) Int. Cl.
| | |
|---|---|
| *H03L 7/00* | (2006.01) |
| *H03L 7/06* | (2006.01) |
| *G06F 1/08* | (2006.01) |
| *H03K 3/72* | (2006.01) |
| *H03K 5/26* | (2006.01) |
| *H03K 7/08* | (2006.01) |
| *H03K 3/017* | (2006.01) |
| *H03L 7/083* | (2006.01) |
| *H03K 3/02* | (2006.01) |

(52) U.S. Cl.
CPC .. *H03L 7/06* (2013.01); *G06F 1/08* (2013.01); *H03K 3/72* (2013.01); *H03K 5/26* (2013.01); *H03K 7/08* (2013.01); *H03K 3/017* (2013.01); *H03K 3/02* (2013.01); *H03L 7/083* (2013.01)

(58) Field of Classification Search
CPC .......... H03L 7/06; H03L 7/083; H03K 3/017; H03K 3/02; H03K 7/08; H03K 5/26; H03K 3/72; G06F 1/08
USPC .... 331/1 A, 18, 25, 34, 108 C, 108 D, 177 R; 327/106, 299
See application file for complete search history.

(56) References Cited

U.S. PATENT DOCUMENTS

| | | | | |
|---|---|---|---|---|
| 4,636,734 | A * | 1/1987 | Genrich ......................... | 327/106 |
| 2008/0069284 | A1* | 3/2008 | Kuhns et al. .................. | 375/376 |
| 2009/0002043 | A1* | 1/2009 | Kris .............................. | 327/175 |
| 2009/0184742 | A1* | 7/2009 | Kris .............................. | 327/160 |
| 2011/0208329 | A1 | 8/2011 | Castor-Perry ................... | 700/94 |
| 2013/0015798 | A1* | 1/2013 | Wright ..................... | 318/400.25 |

OTHER PUBLICATIONS

"PIC10(L)F320/322 Data Sheet 6/8 Pin, High-Performace, Flash Microcontrollers," Microchip Technology Incorporated, 210 pages, Jul. 11, 2011.
Gharoo, Jatinder et al., "AN1470: Manchester Decoder Using the CLC and NCO," Microchip Technology Incorporated, 16 pages, Oct. 17, 2012.
International Search Report and Written Opinion, Application No. PCT/US2014/017540, 12 pages, May 28, 2014.

* cited by examiner

*Primary Examiner* — Richard Tan
(74) *Attorney, Agent, or Firm* — Slayden Grubert Beard PLLC

(57) ABSTRACT

A numerical controlled oscillator generating an output signal with a digital clock signal having a variable frequency is disclosed. The numerical oscillator is controlled by a programmable numerical value being subject to a transfer function and comprises a comparator configured to compare an output of the transfer function with a duty cycle register to generate the output signal.

24 Claims, 7 Drawing Sheets

| $b_{19}$ | $b_{18}$ | $b_{17}$ | $b_{16}$ | $b_{15}$ | $b_{14}$ | $b_{13}$ | $b_{12}$ | ... | $b_0$ |
|---|---|---|---|---|---|---|---|---|---|
| $2^{-1}$ | $2^{-2}$ | $2^{-3}$ | $2^{-4}$ | $2^{-5}$ | $2^{-6}$ | $2^{-7}$ | $2^{-8}$ | ... | $2^{-20}$ |
| 50% | 25% | 12.5% | 6.2% | 3.1% | 1.6% | 0.8% | 0.4% | | 0.5ppm |

*Figure 4*

ENHANCED NUMERICAL CONTROLLED OSCILLATOR

CROSS-REFERENCE TO RELATED APPLICATIONS

This application claims the benefit of U.S. Provisional Application No. 61/767,633 filed on Feb. 21, 2013, which is incorporated herein in its entirety.

TECHNICAL FIELD

The present disclosure relates to a numerical controlled oscillator, in particular a numerical controlled oscillator peripheral for use in a microcontroller.

BACKGROUND

In many microcontrollers, for example microcontrollers manufactured by the assignee of the present disclosure, a numerical controlled oscillator (NCO) module is available. According to various embodiments, such a numerical controlled oscillator module (NCO) peripheral can be used to provide a linear frequency signal control. To this end, the NCO can be used with a technique called Direct Digital Synthesis to generate a frequency which is, on average, very finely adjustable by adding a precisely controlled sum to the generated output.

FIG. 1 shows such a generic numerical oscillator 20 in a peripheral circuit 10 of, for example a microcontroller. The numerical controlled oscillator 20 receives a reference clock r(x) and a numerical value q which may be stored in a configuration register 40, for example a special function register associated with the NCO. The numeric value q entered into the module performs an operation on the reference clock to provide an output frequency f(q). Therefore f(q)=r(x)*A; A is the numeric oscillator transfer function. The transfer function can be as simple as an addition. However other functions can be implemented such as a subtracting, multiplicative, dividing, logarithmic or any other mathematical function. In the following embodiments discussed in this application, a simple adder is used to form a numerical controlled oscillator. However, a numerical controlled oscillator as defined above may have other functions to provide for a numerical controlled clock signal as stated above. Such a numerical oscillator peripheral 10 may provide a fine tunable output frequency which can be used in particular to generate pulse width modulation output in addition to a linear frequency control.

SUMMARY

However, there exists a need for an enhanced numerical oscillator that provides a different output signal or functionality or that provides for additional optional output signals.

According to an embodiment, a numerical controlled oscillator generates an output signal with a digital clock signal having a variable frequency, wherein the numerical oscillator is controlled by a programmable numerical value being subject to a transfer function and comprises a comparator configured to compare whether an output of the transfer function with a duty cycle register and to generate the output signal.

According to a further embodiment, the transfer function can be an addition provided by an adder and an average frequency of the variable frequency can be controlled by an increment register storing the numerical value whose content is added by the adder to an accumulator having an overflow output, and wherein the duty cycle register is coupled with the comparator comprising a "greater" or "equal or greater" function. According to a further embodiment, the numerical controlled oscillator according may further comprise an output multiplexer operable to select an output signal based on the overflow output or an output signal of the comparator. According to a further embodiment, a first input of the adder can be coupled with the increment register, the accumulator is clocked by a selectable clock signal and has an input coupled with an output of the adder and an output coupled with a second input of the adder, wherein the overflow output is coupled with a first input of an AND gate whose second input receives the selected clock signal, and a flip-flop having an input coupled with the output of the AND gate and an output coupled with one input of the output multiplexer. According to a further embodiment, the increment register and/or the duty cycle register can be buffered. According to a further embodiment, the numerical controlled oscillator may further comprise a clock input multiplexer controlled by a control signal to select one of a plurality of input clock signals. According to a further embodiment, the selectable clock signals may comprise an externally provided clock signal and/or an internally provided clock signal. According to a further embodiment, the numerical controlled oscillator may further comprise a ripple counter having a clock input coupled with the selectable clock signal and a multiplexer having a plurality of inputs coupled with a counter value register of the ripple counter, wherein an output of the multiplexer is coupled with a reset input of an SR flip-flop whose set input is coupled with the overflow output of the accumulator, an inverted output of the SR flip-flop resets the ripple counter and a non-inverted output of the SR flip-flop is coupled with a further input of the output multiplexer. According to a further embodiment, the numerical controlled oscillator may further comprise an AND gate having an output coupled with the clock input of the ripple counter and having a first input receiving the selectable clock signal and a second input coupled with the non-inverting output of the SR flip-flop.

According to another embodiment, a microcontroller may comprise numerical controlled oscillator as described above.

According to yet another embodiment, a method for generating a clock signal may comprise the steps of: providing an output signal with a digital clock signal having a variable frequency by a numerical controlled oscillator by subjecting a numerical value to a transfer function generating an output value, providing a duty cycle register coupled with a comparator, wherein the comparator compares the output value with the duty cycle register and generates the output signal when the value of the accumulator is equal or greater to the value of the duty cycle register.

According to a further embodiment of the method, the transfer function can be provided by an adder which adds the numerical value to an accumulator having an overflow output.

According to a further embodiment of the method, the method may further comprise: selecting the overflow output signal or an output signal of the comparator as the output signal of the numerical oscillator. According to a further embodiment of the method, the method may further comprise: coupling a first input of an adder with an increment register, clocking the accumulator by a selectable clock signal and coupling an input of the accumulator with an output of the adder and an output of the accumulator with a second input of the adder, feeding the overflow output of the accumulator to a first input of an AND gate whose second input receives the selected clock signal, and feeding an output signal of the AND gate to a flip-flop having an output providing a selectable clock output signal as the overflow output signal.

According to a further embodiment of the method, the increment register and/or the duty cycle register can be buffered. According to a further embodiment of the method, the method may further comprise selecting a clock input signal by a clock input multiplexer controlled by a control signal. According to a further embodiment of the method, a selectable clock signals may comprise an externally provided clock signal and/or an internally provided clock signal. According to a further embodiment of the method, the method may further comprise: providing a further clock output signal by a ripple counter having a clock input coupled with the selectable clock signal and a multiplexer having a plurality of inputs coupled with a counter value register of the ripple counter, wherein an output of the multiplexer is coupled with a reset input of an SR flip-flop whose set input is coupled with the overflow output of the accumulator, an inverted output of the SR flip-flop resets the ripple counter and a non-inverted output of the SR flip-flop provides the further clock output signal. According to a further embodiment of the method, the method may further comprise ANDing the selectable clock signal and an output signal provided by the non-inverting output of the SR flip-flop by an AND gate and feeding the ANDed signal to the clock input of the ripple counter. According to a further embodiment of the method, the method may further comprise controlling a polarity of the output signal of the numerical controlled oscillator. According to a further embodiment of the method, the method may further comprise providing an output signal of the AND gate as an interrupt signal. According to a further embodiment of the method, the method may further comprise using the digital clock signal within a microcontroller.

BRIEF DESCRIPTION OF THE DRAWINGS

FIG. 4 shows a special function register for controlling the enhanced function according to various embodiments.

DETAILED DESCRIPTION

Figure 1:
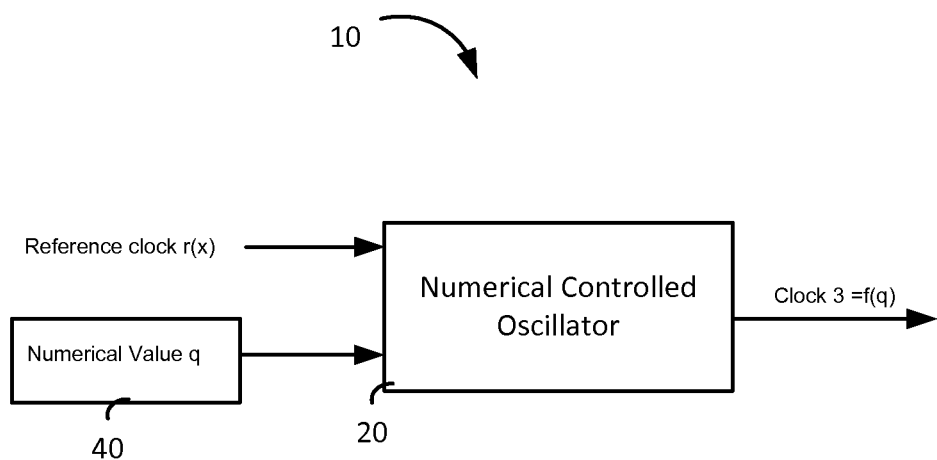
FIG. 1 shows a block diagram of a generic conventional numerical oscillator.
Figure 2:
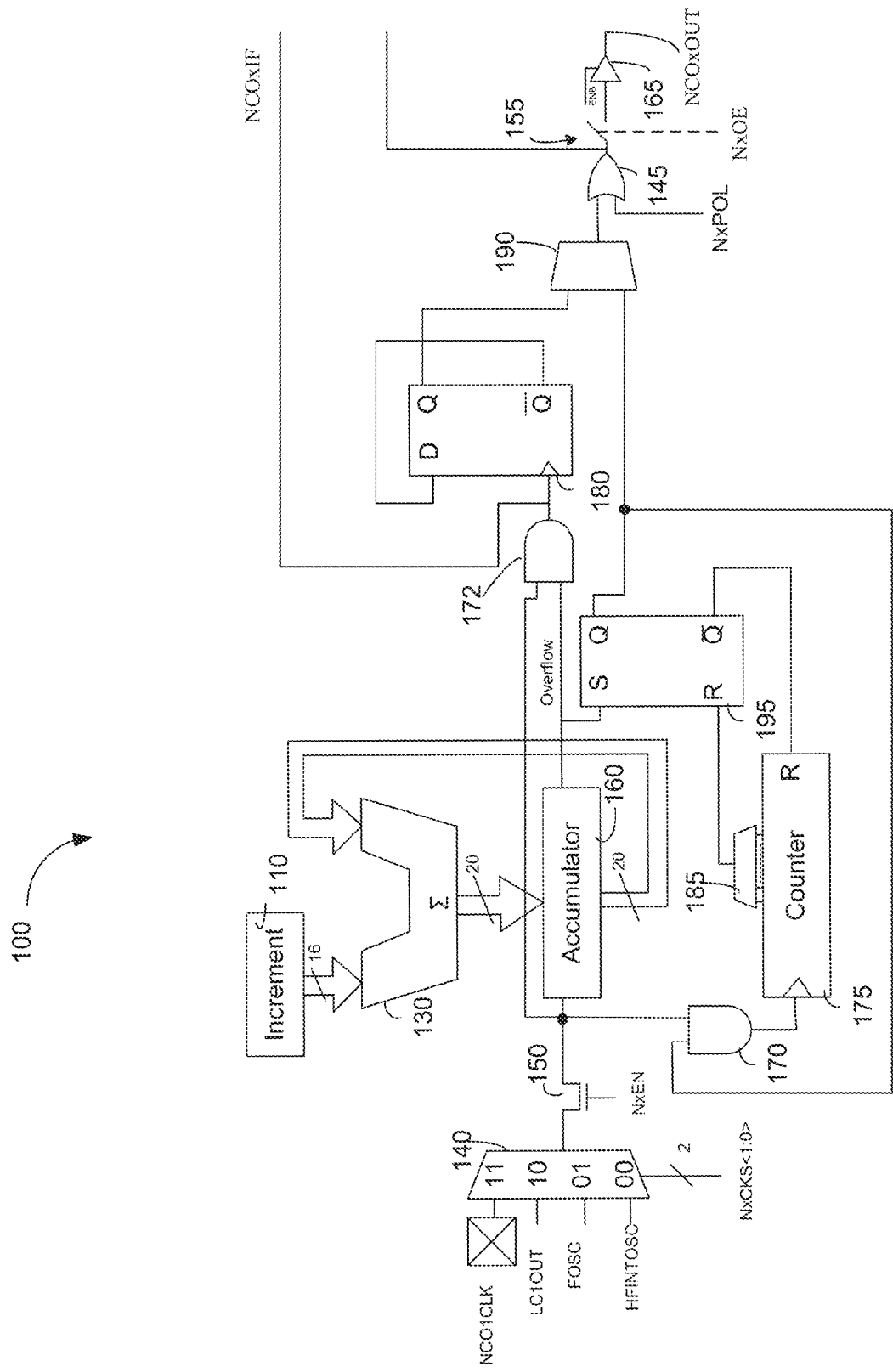
FIG. 2 shows an exemplary conventional numeric oscillator.

FIG. 2 shows an exemplary conventional numerical controlled oscillator that can be implemented as peripheral device within a microcontroller. The Numerically Controlled Oscillator (NCO) module 100 is a timer that uses the overflow from the addition of an increment value to divide the input frequency. The advantage of the addition method over simple counter driven timer is that the resolution of division does not vary with the divider value. However, as mentioned above, other transfer functions may be used in a numerical oscillator. Thus, the present invention is not limited to a numerical oscillator using an adder per se. The NCO 100 is most useful for applications that require frequency accuracy and fine resolution at a fixed duty cycle. Certain features of such an NCO may include: 16-bit increment function, Fixed Duty Cycle (FDC) mode, Pulse Frequency (PF) mode, Output pulse width control, Multiple clock input sources, Output polarity control, and Interrupt capability.

The conventional embodiment as shown in FIG. 2, for example, provides for an input multiplexer 140 controlled by signal NxCKS<1:0> which may be a 2-bit control signal provided by a special function register to select one of four input clock signals NCO1CLK, LC1OUT, FOSC, or HFINTOSC. NCO1CLK may be an external clock signal that can be applied to a dedicated external pin. LC1OUT can be an internal low frequency signal, for example provided by an internal secondary oscillator. FOSC can be the internal system clock and HFINTOSC can be the internally generated clock from an internal RC oscillator. A pass gate 150 may be provided, controlled by an enable signal NxEN which again may be provided by a configuration register associated with the numeric controlled oscillator 100. The selected clock signal drives an accumulator 160 to store an output value processed by adder 130 which receives an increment value 110 at one input and the output value of the accumulator at its second input. Register 110 can be buffered by an additional buffer register 120 (shown in FIG. 3). Accumulator 160 has an overflow output which is coupled with the set input of RS-Flip-Flop 195 and the first input of AND gate 172. The second input of AND gate 172 receives the selected clock signal. The output of AND gate 172 provides a first internal output and is also connected with the clock input of D-Flip-Flop 180 whose inverted output is fed back to its D-input and whose non-inverted output Q provides a clock output of the numerical controlled oscillator fed to the first input of a output select multiplexer 190.

The selected clock is further fed from pass gate 150 to the first input of AND gate 170 whose output is coupled with the clock input of counter 175. The counter value is tapped by a multiplexer 185 whose inputs are connected with the respective bits of counter 175 and whose output is coupled with the reset input of RS-Flip-Flop 195. The inverted output of Flip-Flop 195 resets counter 175 and the non-inverted output Q of Flip-Flop 195 is fed back to the second input of AND gate 170 and provides the second output signal fed to the second input of multiplexer 190. The output of multiplexer 190 is coupled with the first input of OR gate 145 whose output provides a second internal output and is also fed to another switch 155 which feeds the output signal to a tri-state driver 165. OR gate 145 serves to invert or not invert the output of multiplexer 190 based on the state of its other input which is connected to a control register bit NxPOL of, for example, a special function register.

The NCO module operates in a fixed duty cycle operation mode by repeatedly adding a fixed value stored in register 110 to accumulator 160 by means of adder 130. Additions occur at the input clock rate provided by multiplexer 140 and enable gate 150. The accumulator 160 will overflow with a carry periodically, which is the raw NCO output signal. This output can be ANDed with the input clock by means of AND gate 172 to generate an output signal, for example an internal interrupt signal NCOxIF. This signal can further be routed through other logic 180 as shown in FIG. 2 and fed to a multiplexer 190 to generate a final output signal NCOxOUT which is used as the output signal of the numerical controlled oscillator. When multiplexer 190 selects the first input signal, the numerical controlled oscillator provides for a fixed duty cycle output signal NCOxOUT. Multiplexer 190 can also be controlled to select alternatively and optionally a pulse frequency modulation mode using counter 175 and associated logic 170, 185, 195 as shown in the lower part of FIG. 2. However, this additional mode is not required for the present embodiments and may thus be omitted.

According to the functionality of the NCO 100 when operating in fixed duty cycle mode, the input clock is reduced by the ratio of the addition value to the maximum accumulator value:

$$F_{overflow} = (\text{NCO clock frequency} * \text{Increment Value})/2^n,$$

wherein n is the accumulator width in bits.

The NCO output can be further modified by the additional logic 170, 175, 185, and 195 by stretching the pulse or toggling a flip-flop. The modified NCO output can then be distributed internally to other peripherals and optionally output to an external pin. The accumulator overflow also can generate an interrupt NCOxIF. The NCOxOUT signal period changes in discrete steps to create an average frequency. This output depends on the ability of the receiving circuit to average the NCOxOUT output to reduce uncertainty.

The accumulator 160 can be, for example, a 20-bit register. Read and write access to the accumulator 160 may be available, for example, through three 8-bit registers. The NCO Adder 130 can be a full adder, which operates independently from the system clock. The addition of the previous result and the increment value replaces the accumulator value on the rising edge of each input clock.

Figure 3:
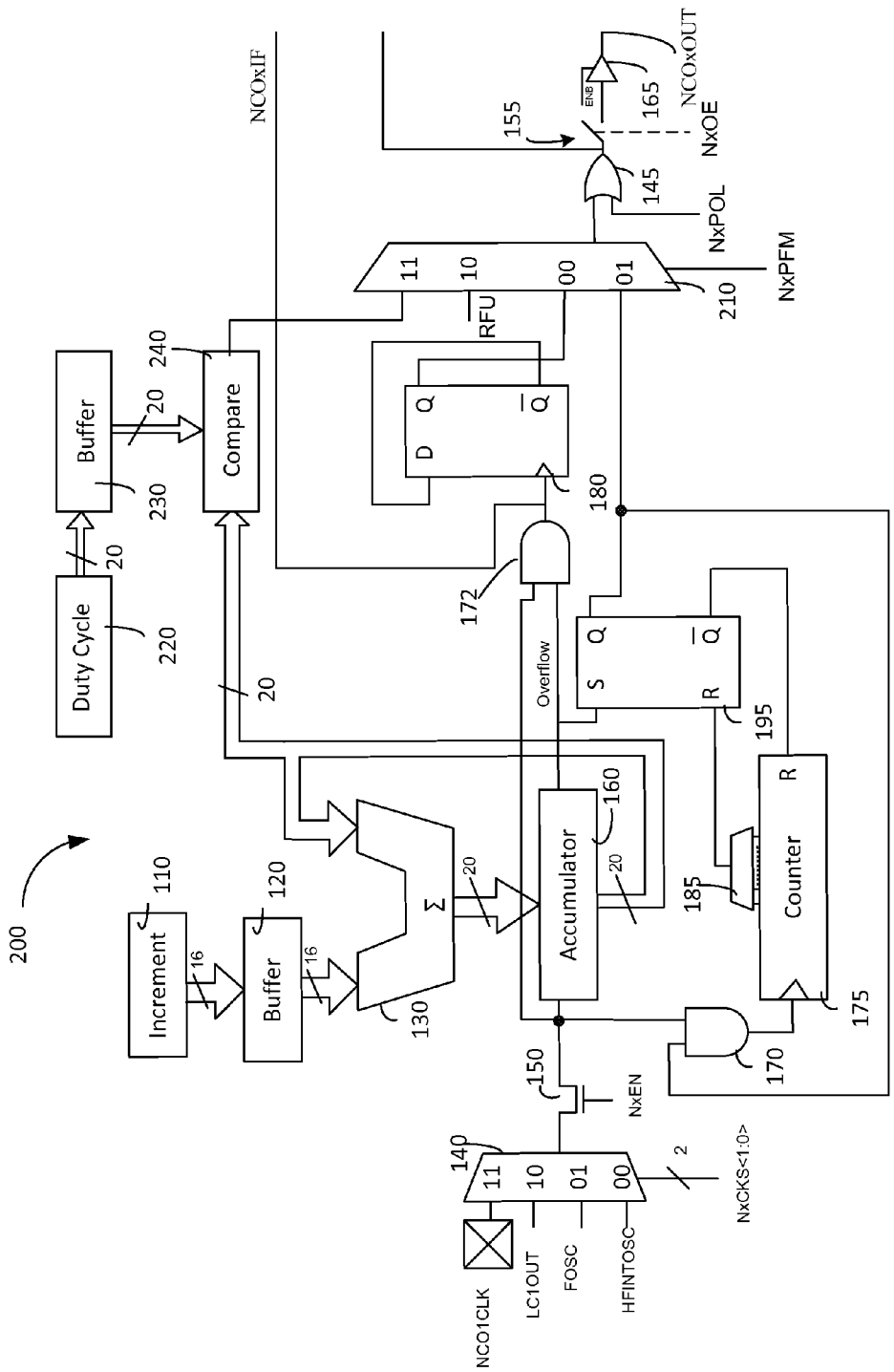
FIG. 3 shows an embodiment of an enhanced numerical oscillator.

The increment value 110 can stored in two 8-bit registers 110 making up a 16-bit increment. Both of these registers 110 can be readable and writeable. The Increment registers 110 can be double-buffered by buffer 120 as shown in FIG. 3 to allow for value changes to be made without first disabling the NCO module 100. The buffer loads are immediate when the module is disabled. Writing to the increment register 110 first is necessary because then the buffer 120 is loaded synchronously with the NCO operation after the write is executed on the Increment register 110.

In Fixed Duty Cycle (FDC) mode, when multiplexer 190 selects the first input, every time the accumulator 160 overflows, the output is toggled. This provides a 50% duty cycle, provided that the increment value remains constant. A timing diagram can be seen in the background window shown in FIG. 5. The FDC mode is selected by clearing a respective control bit in the NCO control register.

In Pulse Frequency (PF) mode, every time the accumulator 160 overflows, the output becomes active for one or more clock periods through additional circuitry 175, 185, 195 as shown in FIG. 2. Once the clock period expires, the output returns to an inactive state. This provides a pulsed output. The output becomes active on the rising clock edge immediately following the overflow event. The value of the active and inactive states depends on a polarity bit in the NCO control register. The PF mode is selected through multiplexer 190 by setting a respective bit in the NCO control register NxPFM which select the second input of multiplexer 190 as shown in FIG. 2.

When operating in PF mode, the active state of the output can vary in width by multiple clock periods. Various pulse widths are selected with respective bits in an NCO clock register which controls multiplexer 185. When the selected pulse width is greater than the accumulator overflow time frame, the output of the NCO operation may be indeterminate.

The last stage in the NCO module is the optional output polarity OR gate 145. The NxPOL bit in the NCO control register selects the output polarity. Changing the polarity while the interrupts are enabled may cause an interrupt for the resulting output transition. The NCO output can be used internally by source code or other peripherals.

The conventional numerical controlled oscillator 100 of FIG. 2 offers just two modes: 50% "fixed" duty cycle and "pulse frequency modulation" mode (one of 8 fixed counts). Therefore its functionality is limited. A frequency change causes unwanted change in duty cycle (PFM mode).

According to various embodiments, a numerical controlled oscillator can be enhanced to have additional features. According to various embodiments, for example, an NCO can be enhanced to allow arbitrary duty cycle options. Conventional NCO's do not support arbitrary duty cycle, but rather only a fixed number of taps. Thus, an NCO as shown in FIG. 2 can be enhanced with minimal additional silicon to provide for an enhanced functionality.

According to various embodiments, the design of an NCO peripheral 200, for example, for use in a microcontroller can be enhanced as shown in FIG. 3. As discussed above, conventional numerical controlled oscillators are implemented in microcontrollers for example, in 8 bit microcontroller devices such as the PIC12/16F150x and PIC10F3xx families manufactured by Applicant. The enhanced numerical controlled oscillator greatly improves a conventional NCO design by offering the ability to output an arbitrary duty cycle. The enhancement requires very little increase of silicon and is thus a very low cost improvement.

As stated above the options of a conventional NCO as shown in FIG. 2 provide only a fixed 50% duty cycle, or a fixed "active" time based on 8 different settings of the register bits NxPWS. This gives very limited duty cycle options. FIG. 3 shows an improved embodiment of a numerical controlled oscillator. The modifications, allow the NCO to add arbitrary duty cycle to the options this modules offers, without disturbing the current modes. To implement this feature, the multiplexer 210 controlled by NxPFM bits in a special function register is expanded to offer additional options. To this end, multiplexer 210 is controlled adding one extra NxPFM bit to select one of four inputs. The 4th option that results from the binary selection design of the multiplexer can be used in future enhancement options to the enhanced NCO peripheral and is marked "RFU" in FIG. 3.

To implement the arbitrary duty cycle, a digital (magnitude) compare block 240 is used with a buffered duty cycle register 220/230. The number of bits may be equal to the accumulator 160, or may be less for a simpler implementation, wherein when less bits are used, the bits used in this case would be the most significant bits. The output sets a bit which controls the active and inactive state of the NCOxOUT output when multiplexer 210 selects input "11" as shown in FIG. 3. This change is shown in the circuit diagram of FIG. 3 with the additional elements compared to the conventional solution as shown in FIG. 2.

The value of the accumulator 160 in an NCO 200 is compared to a duty cycle register 220/230 which can be buffered according to some embodiments. The output of the comparison by comparator 240 generates a signal which results in a variable duty cycle pulse width modulation (PWM), wherein the duty cycle is based on the simple ratio between the duty cycle register 220/230 and the bits of the accumulator register 160. Thus, comparator 240 performs an either an "greater" comparison or according to another embodiment an "equal or greater" comparison. The solution allows fixed duty cycle even with changing frequency, as the duty cycle register 230 is always compared to the accumulator 160 which is always the same size. The example shown uses 20 bits, but any number of bits may be used for a wide frequency range.

As with other NCO designs, the increment register 110/120 sets the frequency. The comparison result between the accumulator 160 and the duty cycle register 220/230 is not used to reset the output.

Any conventional NCO design only looks at the overflow bit which results in a 50% duty cycle. Thus, an enhanced numerical controlled oscillator 200 permits arbitrary duty cycle options and not just 8 time options, by the implementation of a true duty cycle register 220/230. A wide frequency range of operation is thus preserved. The implementation according to some embodiments can be code compatible with a conventional NCO as discussed above. Finally, the implementation does not require a lot of additional logic or redesign and therefore provides for a low cost enhancement.

FIG. 4 shows the effect provided by a true duty cycle. A 20 bit register allows selection of a duty cycle up to 100% with a 0.5 ppm precision. Thus a duty cycle selection may only be limited due to jitter, however, any number of bits may be implemented.

Figure 5A:
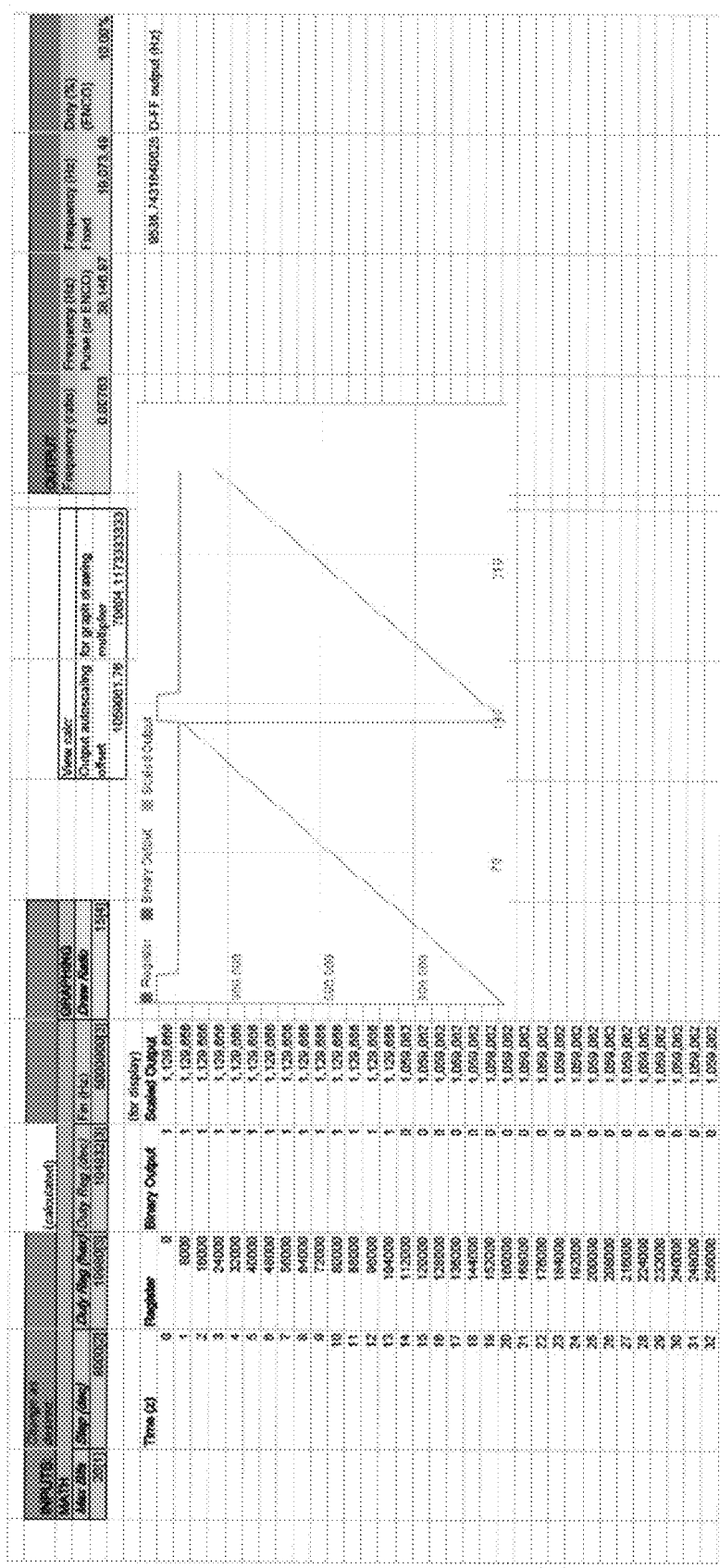
FIG. 5a-c show various output values for the enhanced numerical oscillator according to FIG. 3.
Figure 5B:
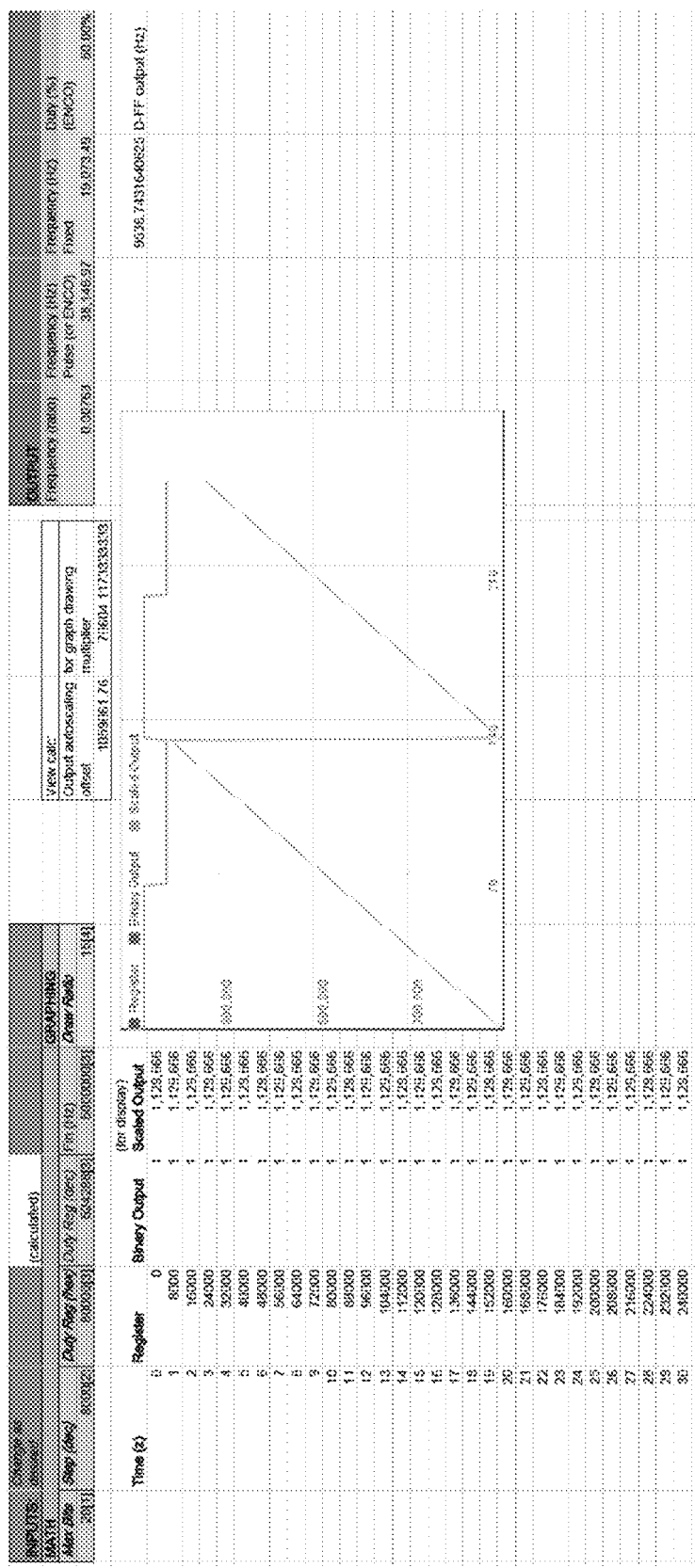
Figure 5C:
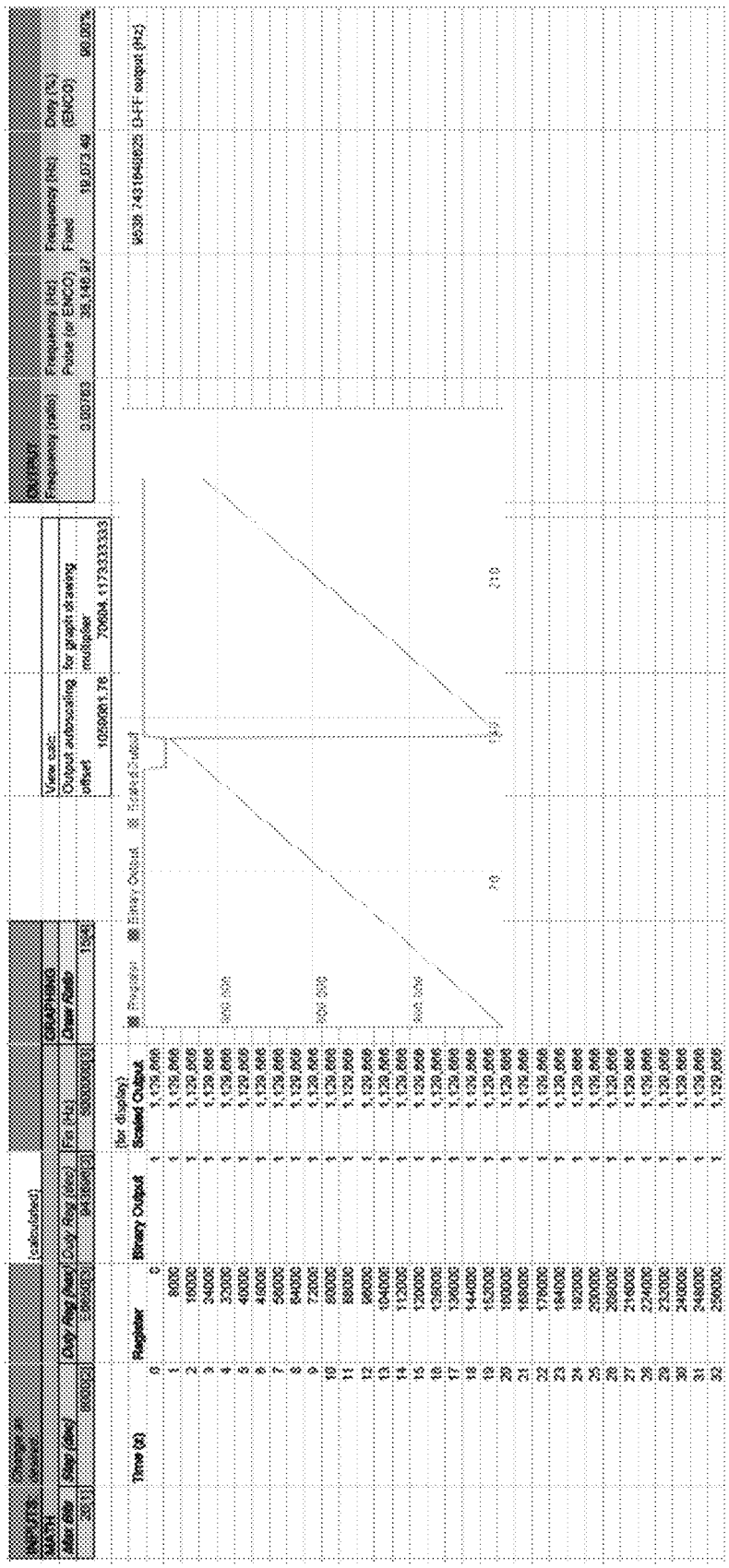

FIG. 5a shows in the front window simulated output values of an enhanced numerical controlled oscillator wherein a duty cycle of 10% is selected. FIG. 5a shows in the front window simulated output values of an enhanced numerical controlled oscillator wherein a duty cycle of 50% is selected. FIG. 5c shows in the front window simulated output values of an enhanced numerical controlled oscillator wherein a duty cycle of 90% is selected.

What is claimed is:

1. A numerical controlled oscillator generating an output signal with a digital clock signal having a variable frequency, wherein the numerical oscillator is controlled by a programmable numerical value being subject to a transfer function and comprises a comparator configured to compare an output value of the transfer function with an output value of a duty cycle register and to generate the output signal, wherein the output signal has a first logic state when the output value of the transfer function is equal to or greater than the output value of the duty cycle register and otherwise a second logic state.

2. The numerical controlled oscillator according to claim 1, wherein the transfer function is an addition provided by an adder and wherein an average frequency of the variable frequency can be controlled by an increment register storing said numerical value whose content is added by the adder to an accumulator having an overflow output, and wherein the duty cycle register is coupled with the comparator.

3. The numerical controlled oscillator according to claim 2, comprising an output multiplexer operable to select the output signal based on the overflow output or the output signal of the comparator.

4. The numerical controlled oscillator according to claim 3, wherein a first input of the adder is coupled with the increment register, the accumulator is clocked by a selectable clock signal and has an input coupled with an output of the adder and an output coupled with a second input of the adder, wherein the overflow output is coupled with a first input of an AND gate whose second input receives the selected clock signal, and a flip-flop having an input coupled with an output of the AND gate and an output coupled with one input of the output multiplexer.

5. The numerical controlled oscillator according to claim 2, wherein the increment register is buffered.

6. The numerical controlled oscillator according to claim 1, wherein the duty cycle register is buffered.

7. The numerical controlled oscillator according to claim 4, further comprising a clock input multiplexer controlled by a control signal to select one of a plurality of input clock signals.

8. The numerical controlled oscillator according to claim 7, wherein the selectable clock signal comprises an externally provided clock signal and/or an internally provided clock signal.

9. The numerical controlled oscillator according to claim 4, further comprising a ripple counter having a clock input coupled with the selectable clock signal and a multiplexer having a plurality of inputs coupled with a counter value register of said ripple counter, wherein an output of the multiplexer is coupled with a reset input of a SR flip-flop whose set input is coupled with the overflow output of the accumulator, an inverted output of the SR flip-flop resets said ripple counter and a non-inverted output of the SR flip-flop is coupled with a further input of said output multiplexer.

10. The numerical controlled oscillator according to claim 9, further comprising a second AND gate having an output coupled with the clock input of the ripple counter and having a first input receiving the selectable clock signal and a second input coupled with the non-inverted output of the SR flip-flop.

11. A microcontroller comprising the numerical controlled oscillator according to claim 1.

12. A method of generating a clock signal, comprising steps of: providing an output signal with a digital clock signal having a variable frequency by a numerical controlled oscillator by subjecting a numerical value to a transfer function generating an output value, providing a duty cycle register coupled with a comparator, wherein the comparator compares the output value of the transfer function with an output value of the duty cycle register and generates the output signal, wherein the output signal has a first logic state when the output value of the transfer function, which is a value of an accumulator, is equal to or greater than the output value of the duty cycle register and otherwise a second logic state.

13. The method according to claim 12, wherein the transfer function is provided by an adder which adds the numerical value to an accumulator having an overflow output.

14. The method according to claim 13, further comprising selecting a signal based on the overflow output or the output signal as the output signal of the numerical oscillator.

15. The method according to claim 14, further comprising coupling a first input of the adder with an increment register, clocking the accumulator by a selectable clock signal and coupling an input of the accumulator with an output of the adder and an output of the accumulator with a second input of the adder, feeding the overflow output of the accumulator to a first input of a first AND gate whose second input receives the selected clock signal, and feeding an output signal of the first AND gate to a flip-flop having an output providing a selectable clock output signal as the overflow output signal.

16. The method according to claim 15, wherein the increment register is buffered.

17. The method according to claim 12, wherein the duty cycle register is buffered.

18. The method according to claim 15, further comprising selecting a clock input signal by a clock input multiplexer controlled by a control signal.

19. The method according to claim 18, wherein the selectable clock signal comprises an externally provided clock signal and/or an internally provided clock signal.

20. The method according to claim 15, further comprising providing a further clock output signal by a ripple counter having a clock input coupled with the selectable clock signal and a multiplexer having a plurality of inputs coupled with a counter value register of said ripple counter, wherein an output of the multiplexer is coupled with a reset input of a SR flip-flop whose set input is coupled with the overflow output of the accumulator, an inverted output of the SR flip-flop is coupled with a reset input of said ripple counter and a non-inverted output of the SR flip-flop provides said further clock output signal.

21. The method according to claim 20, further comprising ANDing the selectable clock signal and said further clock output signal by a second AND gate and feeding the ANDed signal to the clock input of the ripple counter.

22. The method according to claim 12, further comprising controlling a polarity of the output signal of the numerical controlled oscillator.

23. The method according to claim 21, further comprising providing an output signal of said first AND gate as an interrupt signal.

24. The method according to claim 12, further comprising using said digital clock signal within a microcontroller.

* * * * *